United States Patent [19]
Edwards et al.

[11] Patent Number: 5,363,553
[45] Date of Patent: Nov. 15, 1994

[54] METHOD OF DRILLING VIAS AND THROUGH HOLES

[75] Inventors: Robert D. Edwards; Frank D. Egitto, both of Binghamton; Thomas P. Gall, Endwell; Paul S. Gursky, Vestal; David E. Houser, Apalachin; James S. Kamperman; Warren R. Wrenner, both of Endicott, all of N.Y.

[73] Assignee: International Business Machines, Inc., Armonk, N.Y.

[21] Appl. No.: 98,085

[22] Filed: Jul. 27, 1993

[51] Int. Cl.$^5$ .............................................. H01K 3/10
[52] U.S. Cl. ........................................ 29/852; 29/846; 156/901; 156/902; 174/262
[58] Field of Search ................... 29/852, 846; 156/901, 156/902; 174/262, 266

[56] References Cited
U.S. PATENT DOCUMENTS
4,830,704  5/1989  Voss et al. ...................... 156/902 X

*Primary Examiner*—Carl J. Arbes
*Attorney, Agent, or Firm*—Richard M. Goldman

[57] ABSTRACT

Disclosed is a method of producing vias and through holes through a metal laminate. The laminate is a multilayer, for example, a trilayer of a relatively hard metal between two layers of a relatively soft metal. The method includes the steps of first etching a clearance hole through the soft metal on one side of the trilayer laminate, followed by partially etching the hard metal layer. Next, drilling the remaining thickness of the hard metal, and drilling through the second layer of soft metal.

1 Claim, 3 Drawing Sheets

METHOD OF DRILLING VIAS AND THROUGH HOLES

CROSS REFERENCE TO RELATED APPLICATIONS

This application is related to the following co-pending, commonly assigned U.S. patent applications:

U.S. patent application Ser. No. 08/097,544, filed Jul. 27, 1993 by Charles Davis, Thomas, Duffy, Steven Hankovic, Howard Heck, John Kolias, and John Kresge, David Light, and Ajit Trevidi for *Method of Fabricating A Flex Laminate Package.*

U.S. patent application Ser. No. 08/097,744, filed Jul. 27, 1993 by Raymond T. Galasco and Jayanal T. Molla for *Solder Bonded Parallel Processor Package Structure and Method of Solder Bonding.*

U.S. patent application Ser. No. 08/097,810, filed Jul. 27, 1993 by Thomas Gall and James Wilcox for *Method and Apparatus for Electrodeposition.*

U.S. patent application Ser. No. 08/097,606, filed Jul. 27, 1993 by John H. C. Lee, Ganesh Subbaryan, and Paul G. Wilkins for *Electromagnetic Bounce Back Braking for Punch Press and Punch Press Process.*

U.S. patent application Ser. No. 08/098,485, filed Jul. 27, 1993 by Thomas Gall, Howard Heck, and John Kresge for *Parallel Processor and Method of Fabrication.*

U.S. patent application Ser. No. 08/097,520, filed Jul. 27, 1993 by Thomas Gall and James Loomis for *Parallel Processor Structure and Package.*

U.S. patent application Ser. No. 08/097,605, filed Jul. 27, 1993 by Chi-Shi Chang and John P. Koons for *Parallel Processor Bus Structure and Package Incorporating The Bus Structure.*

U.S. patent application Ser. No. 08/097,603, filed Jul. 27, 1993 by Thomas Gall, James Loomis, David B. Stone, Cheryl L. Tytran, and James R. Wilcox for *Fabrication Tool and Method for Parallel Processor Structure and Package.*

U.S. patent application Ser. No. 08/097,601, filed Jul. 27, 1993 by John Andrejack, Natalie Feilchenfeld, David B. Stone, Paul Wilkin, and Michael Wozniak for *Flexible Strip Structure for a Parallel Processor and Method of Fabricating The Flexible Strip.*

U.S. patent application Ser. No. 08/097,604, filed Jul. 27, 1993 by Donald Lazzarini and Harold Kohn for *Method of Fabricating A Parallel Processor Package.*

FIELD OF THE INVENTION

The invention relates to via and through hole structures for parallel processors, and more particularly to parallel processors having a plurality of printed circuit cards and/or boards, e.g., dedicated printed circuit cards and/or boards, for carrying processors, memory, and processor/memory elements. The printed circuit cards and/or boards are mounted on and interconnected through a plurality of circuitized flexible cable substrates, i.e., flex strips. The circuitized flexible cable substrates, i.e., flex strips, connect the separate printed circuit boards and cards through a central laminate portion. This central laminate portion provides Z-axis, layer to layer means for inter-processor, inter-memory, inter-processor/memory element, and processor to memory bussing interconnection, and communication through vias and through holes extending from flex strip to flex strip through the laminate. The particular invention described herein relates to a method of producing vias and through holes through the metal laminate used inside the flex. The laminate is a trilayer of a relatively hard metal between two layers of a relatively soft metal. The method includes the steps of first etching a clearance hole through the soft metal on one side of the trilayer laminate, followed by partially etching the hard metal layer, and drilling the remaining thickness of the hard metal. In the final step the second layer of soft metal is drilled through.

BACKGROUND OF THE INVENTION

Parallel processors have a plurality of individual processors, all capable of cooperating on the same program. Parallel processors can be divided into Multiple Instruction Multiple Data (MIMD) and Single Instruction Multiple Data (SIMD) designs.

Multiple Instruction Multiple Data (MIMD) parallel processors have individual processing nodes characterized by fast microprocessors supported by many memory chips and a memory hierarchy. High performance inter node communications coprocessor chips provide the communications links to other microprocessors. Each processor node runs an operating system kernel, with communications at the application level being through a standardized library of message passing functions. In the MIMD parallel processor both shared and distributed memory models are supported.

Single Instruction Multiple Data (SIMD) parallel processors have a plurality of individual processor elements under the control of a single control unit and connected by an intercommunication unit. SIMD machines have an architecture that is specified by:

1. The number of processing elements in the machine.
2. The number of instructions that can be directly executed by the control unit. This includes both scalar instructions and program flow instructions.
3. The number of instructions broadcast by the control unit to all of the processor elements for parallel execution. This includes arithmetic, logic, data routing, masking, and local operations executed by each active processor element over data within the processor element.
4. The number of masking schemes, where each mask partitions the set of processor elements into enabled and disabled subsets.
5. The number of data routing functions, which specify the patterns to be set up in the interconnection network for inter-processor element communications.

SIMD processors have a large number of specialized support chips to support dozens to hundreds of fixed point data flows. Instructions come from outside the individual node, and distributed memory is supported.

Parallel processors require a complex and sophisticated intercommunication network for processor-processor and processor-memory communications. The topology of the interconnection network can be either static or dynamic. Static networks are formed of point-to-point direct connections which will not change during program execution. Dynamic networks are implemented with switched channels which can dynamically reconfigure to match the communications requirements of the programs running on the parallel processor.

Dynamic networks are particularly preferred for multi-purpose and general purpose applications, Dynamic networks can implement communications patterns based on a program demands. Dynamic networking is provided by one or more of bus systems, multistage intercommunications networks, and crossbar switch networks.

Critical to all parallel processors, and especially to dynamic networks is the packaging of the interconnection circuitry. Specifically, the interconnection must provide high speed switching, with low signal attenuation, low crosstalk, and low noise.

SUMMARY OF THE INVENTION

The invention relates to parallel processors, and more particularly to parallel processors having a plurality of printed circuit cards and/or boards, e.g., dedicated printed circuit cards and/or boards, for carrying processors, memory, and processor/memory elements. The printed circuit cards and/or boards are mounted on a plurality of circuitized flexible substrates, i.e., flex strips. The circuitized flexible substrates connect the separate printed circuit boards and cards through a relatively rigid central laminate portion. This central laminate portion provides means, e.g. Z-axis means, for inter-processor, inter-memory, inter-processor/memory element, and processor to memory bussing interconnection, and communication.

Parallel processor systems have a plurality of individual processors, e.g., microprocessors, and a plurality of memory modules. The processors and the memory can be arrayed in one of several interconnection topologies, e.g., an SIMD (single instruction/multiple data) or an MIMD (multiple instruction/multiple data).

The memory modules and the microprocessors communicate through various topologies, as hypercubes, and toroidal networks, solely by way of exemplification and not limitation, among others. These inter-element communication topologies have various physical realizations. According to the invention described herein, the individual logic and memory elements are on printed circuit boards and cards. These printed circuit boards and cards are, in turn, mounted on or otherwise connected to circuitized flexible substrates extending outwardly from a relatively rigid, circuitized laminate of the individual circuitized flexible substrates. The intercommunication is provided through a switch structure that is implemented in the laminate. This switch structure, which connects each microprocessor to each and every other microprocessor in the parallel processor, and to each memory module in the parallel processor, has the physical structure shown in FIG. 1 and the logical/electrical structure shown in FIG. 2.

More particularly, the preferred physical embodiment of this electrical and logical structure is a multilayer switch structure shown in FIG. 1. This switch structure provides separate layers of flex 21 for each unit or pairs of units, that is, each microprocessor, each memory module, or each microprocessor/memory element. The planar circuitization, as data lines, address lines, and control lines are on the individual printed circuit boards and cards 25, which are connected through the circuitized flex 21, and communicate with other layers of flex through Z-axis circuitization (vias and through holes) in the central laminate portion 21 in FIG. 1. The bus structure is illustrated in FIG. 2, which shows a single bus, e.g., a data bus as the A Bus, the B Bus, or the O Bus, connecting a plurality of memory units through a bus, represented by OR-gates, to four processors. The Address Bus, Address Decoding Logic, and Read/Write Logic are not shown. The portion of the parallel processor represented by the OR gates, the inputs to the OR gates, and the outputs from the OR gates is carried by the laminated flex structure 41.

Structurally the parallel processor 11 has a plurality of integrated circuit chips 29, as processor chips 29a mounted on a plurality of printed circuit boards and cards 25. For example, the parallel processor structure 11 of our invention includes a first processor integrated circuit printed circuit board 25 having a first processor integrated circuit chip 29a mounted thereon and a second processor integrated circuit printed circuit board 25 having a second processor integrated circuit chip 29a mounted thereon.

Analogous structures exist for the memory integrated circuit chips 29b, the parallel processor 11 having a plurality of memory chips 29b mounted on a plurality of printed circuit boards and cards 25. In a structure that is similar to that for the processor chips, the parallel processor 11 of our invention includes a first memory integrated circuit printed circuit board 25 having a first memory integrated circuit chip 29b mounted thereon, and a second memory integrated circuit printed circuit board 25 having a second memory integrated circuit chip 29b mounted thereon.

Mechanical and electrical interconnection is provided between the integrated circuit chips 29 mounted on different printed circuit boards or cards 25 by a plurality of circuitized flexible strips 21. These circuitized flexible strips 21 each have a signal interconnection circuitization portion 211, a terminal portion 213 adapted for carrying a printed circuit board or card 25, and a flexible, circuitized portion 212 between the signal interconnection circuitization portion 211 and the terminal portion 213. The signal interconnection circuitization portion 211, has X-Y planar circuitization 214 and vias and through holes 215 for Z-axis circuitization.

The flexible circuitized strips 21 are laminated at their signal interconnection circuitization portion 211. This interconnection portion is built up as lamination of the individual circuitized flexible strips 21, and has X-axis, Y-axis, and Z-axis signal interconnection between the processor integrated circuit chips 29a and the memory integrated circuit chips 29b. In the resulting structure the circuitized flexible strips 21 are laminated in physical and electrical connection at their signal interconnection circuitization portions 211 and spaced apart at their terminal portions 213.

The power core 221 may be a copper foil, a molybdenum foil, or a "CIC" (Copper-Invar-Copper) laminate foil. The circuitized flexible strip 21 may be a 1S1P (one signal plane, one power plane) circuitized flexible strip, a 2S1P (two signal planes, one power plane) circuitized flexible strip or a 2S3P (two signal planes, three power planes) circuitized flexible strip.

The circuitized flexible strip 21 can have either two terminal portions 213 for carrying printed circuit boards 25 at opposite ends thereof, or a single terminal portion 213 for carrying a printed circuit board 25 at only one end of the circuitized flexible cable 21. Where the circuitized flexible strip 21 is adapted to carry a printed circuit board 25 at only one end, a pair of circuitized flexible strips 21, each having a terminal portion 213 at only one end can be laminated so that their signal interconnection circuitization portions 211 overlap but their terminal portions 213 and their flexible, circuitized 212 portions extend outwardly from opposite sides of the signal interconnection circuitization laminated body portion 41 of the parallel processor package 11.

According to our invention there is provided a method of drilling power connection holes through a metal laminate, where the laminate is a multi-layer, e.g., a trilayer of a relatively hard metal, such as an Invar alloy, between two layers of a relatively soft metal, such as copper, or a two layer laminate including copper. According to this embodiment of the invention a clearance hole, such as a chemically etched or laser etched clearance hole is provided in the soft metal prior to drilling the harder metal.

In one exemplification of this embodiment of the invention we etch the clearance hole through the soft metal on one side of the trilayer laminate, and partially etch the hard metal layer. This is followed by drilling the remaining thickness of the hard metal, and drilling through the second layer of soft metal.

According to a still further method of the invention through holes are drilled in the multi-layer substrate by laser drilling a shallow pilot hole in the dielectric or in a drill entry sheet and thereafter mechanically drilling the through hole.

THE FIGURES

The invention may be understood by reference to the Figures appended hereto.

DETAILED DESCRIPTION OF THE INVENTION

Figure 1:
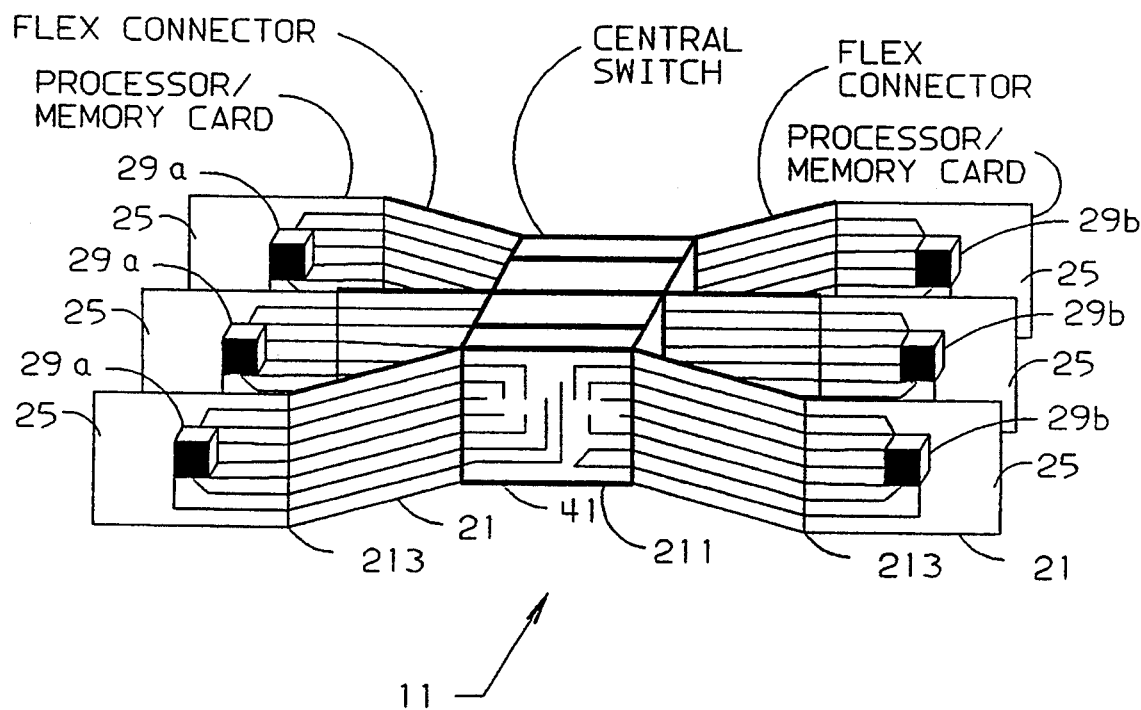
FIG. 1 shows an overview of the mechanical and structural features of the parallel processor package of the invention.

The invention described herein relates to a parallel processor 1 and a parallel processor package 11 having a plurality of integrated circuit chips 29, e.g., microprocessors 29a, preferably advanced microprocessors, and memory modules 29b, mounted on printed circuit cards and boards 25, and connected through a laminate 41 of circuitized flexible strips 21 as will be described herein below. The structure and methods of fabricating the structure and similar structures are useful in parallel processors, in bank switched memory with memory banks or fractional memory banks on an individual flex connector, and for providing flex cable to flex cable connection in a heavily interconnected network.

Advanced microprocessors, such as pipelined microprocessors and RISC (reduced instruction set computer) microprocessors provide dramatic increases in chip level integration and chip level circuit densities. These advanced microprocessors, in turn, place increasing demands on wiring densities and interconnections at the next lower levels of packaging. Moreover, when advanced microprocessors are combined into multiprocessor configurations, i.e., parallel processors, as SIMD and MIMD parallel processors, still higher levels of performance, circuit density, including logic density and memory density, and I/O packaging, are all required.

Figure 2:
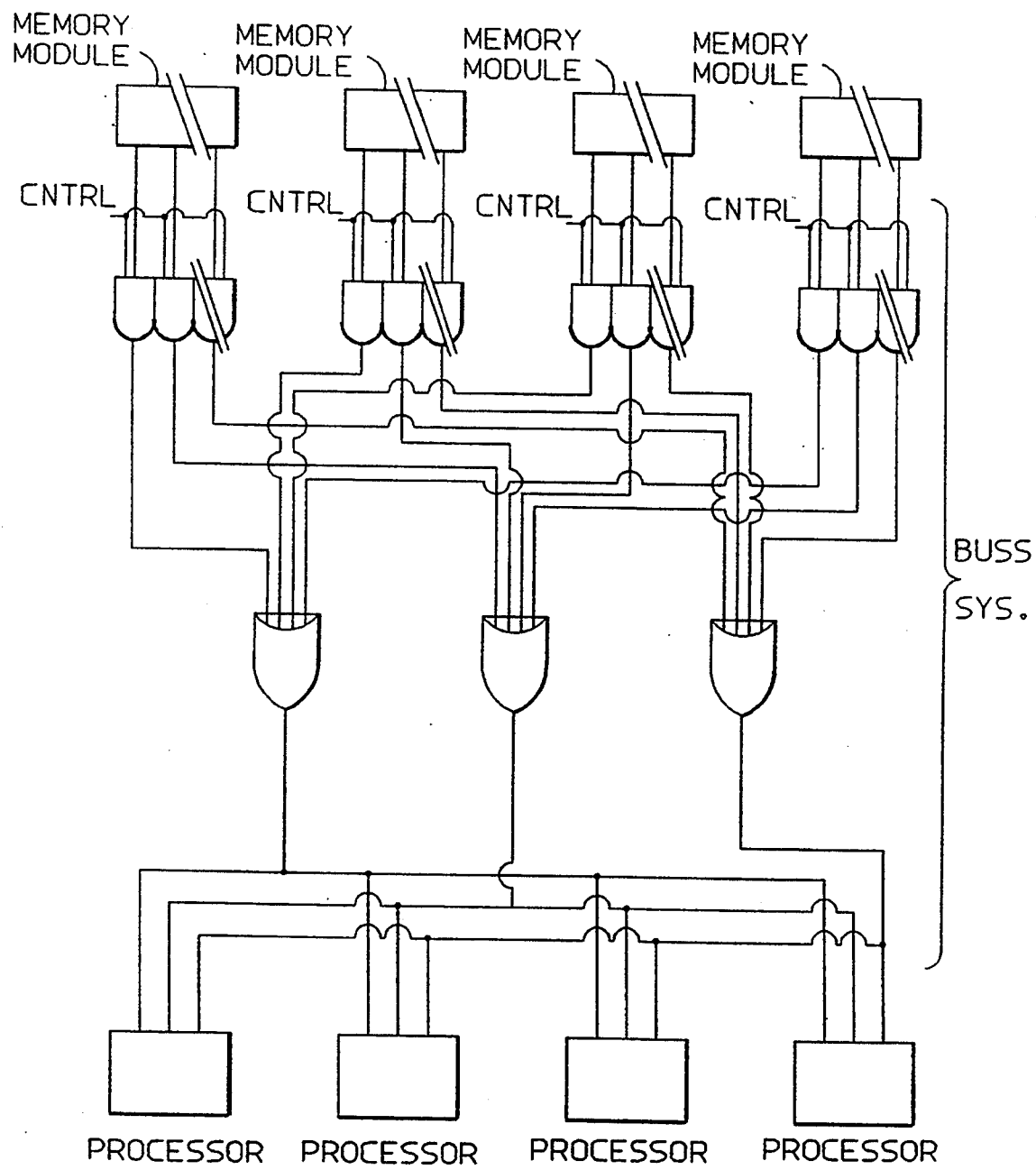
FIG. 2 shows a generalized and simplified schematic of one bus of bus structures that can be implemented in the package of the invention.

The basic parallel processor structure 11 of the invention, e.g., an SIMD or an MIMD parallel processor, builds from a plurality of microprocessors 29a and a plurality of memory modules 29b, with the memory modules 29b and the microprocessors 29a communicating through a laminate switch structure 11. This switch, which connects each microprocessor 29a to each and every other microprocessor 29a in the parallel processor 1, and to each memory module 29b in the parallel processor 1, has the logical/electrical structure shown in FIG. 2.

Laminate Switch Structure

Figure 3:
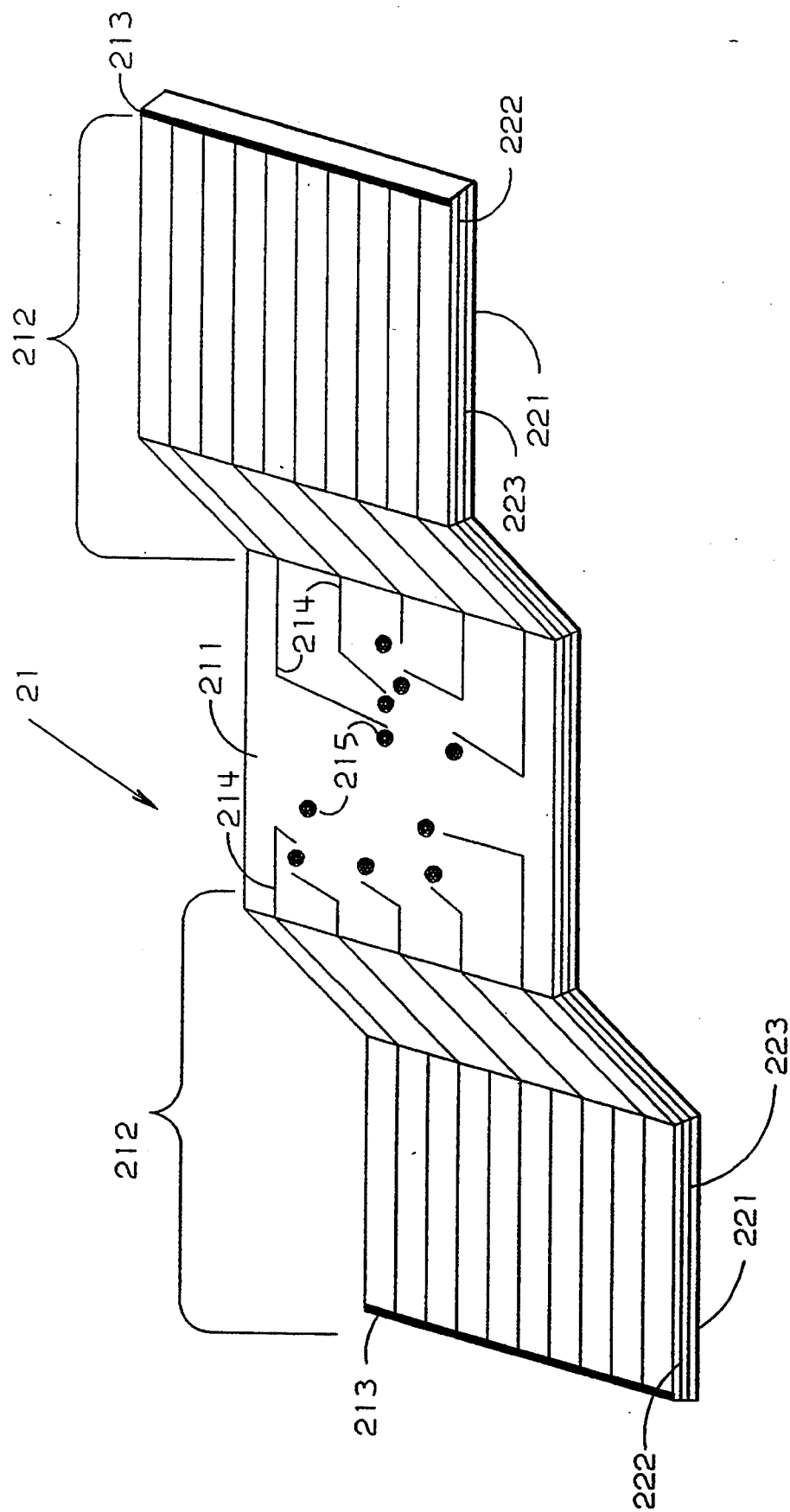
FIG. 3 shows a perspective view of a circuitized flexible strip of the invention having surface circuitization, Pd dendrites for connecting the printed circuit boards or cards thereto, and joining metallurgy, vias, and through holes on the portion intended to be laminated.

The parallel processor package 11 of the invention integrates carrier, connector, and I/O into a single package, with multiple circuitized flexible cables 21 that are built into a carrier cross section 41 using discrete subassemblies 21 which are laminated together to form a Z-axis signal and power connection laminate 41 between the discrete subassemblies 21. A discrete subassembly is shown generally in FIG. 3.

The physical embodiment of the package 11 yields high performance by utilizing high wirability printed circuit board technology that enhances present printed circuit card and board technology for massively parallel processor systems, while providing cost and performances advantages. Both the laminate 41, which we refer to as a central, switch, or rigid portion, and the outwardly extending flex portions 21 (intended for attachment to printed circuit boards or cards 25 carrying the memory modules 29b and the logic modules 29a) are characterized by printed circuit board like cross sections, and a low dielectric constant polymer substrate.

The physical embodiment of this electrical and logical structure encompasses the multilayer laminate switch structure shown in FIG. 1. This switch structure provides a separate layer of flex 21 for each printed circuit board or card 25 or each pair thereof. Each individual printed circuit board or card 25 can carry a microprocessor 29a, a memory module 29b, I/O, or a microprocessor/memory element. The planar circuitization 214, as data lines, address lines, and control lines is on the flex 21, and communicates with other layers of flex 21 through vias and through holes 217 in the laminate central portion 41, shown in FIG. 3.

This laminate flex design provides a large number of I/O's, for example twenty five thousand or more, from the package 11 while eliminating the need for the manufacture, alignment, and bonding of discrete flex cables extending outwardly from a single panel. A conventional planar panel would have to be many times larger to have room for the same connectivity as the integrated flex/rigid/flex or rigid/flex of the invention.

Flex Card Carriers Joined at a Central Laminate Switch Portion

The package 1 of the invention combines a laminate central or switch portion 41 and circuitized flexible strip extensions 21 extending outwardly therefrom and carrying terminal printed circuit boards and cards 25 for circuit elements 29a and 29b, as integrated circuit chips 29, thereon.

Heretofore flex cables and flex carriers have been integrated onto one or two surfaces, i.e., the top surface or the top and bottom surfaces, of a carrier. However, according to the present invention the flex cables 21 are integrated into a central switch or carrier structure 41 as a laminate with a plurality of stacked, circuitized flex strips 21. The area selective lamination of the flex carriers 21 in the central region 211 forms the rigid laminate carrier 41. This laminate region 41 carries the Z-axis circuitization lines from flex 21 to flex 21.

The individual plies of flex 21 have internal conductors, i.e., internal power planes 221 and internal signal planes 222. Additionally, in order to accommodate the narrow dimensional tolerances associated with the high I/O density, high wiring density, and high circuit density, it is necessary to carefully control the Coefficient of Thermal Expansion (CTE) of the individual subassemblies. This is accomplished through the use of an internal metallic conductor 221 of matched coefficient of thermal expansion (CTE), such a molybdenum foil or a Cu/Invar/Cu foil, to which the layers of dielectric 223 are laminated.

The combination of circuitized flex 21 extending outwardly from a central laminate section 41, with vias 215 and through holes 215 electrically connecting separate plies 21 of circuitized flex therethrough, reduces the footprint associated with the chip carrier, as wiring escape is easier.

This structure offers many advantages for a parallel processor, especially a massively parallel processor, as well as any other heavily interconnected system. Among other advantages, a reduced size chip carrier is possible, as escape is made easier, signal transmission lengths are reduced, and discontinuities due to contact mating between chip carrier and flex are reduced and reliability is enhanced as the chip carrier and the flex are a single entity.

The design of the parallel processor package calls for all vertical (Z-axis) connections to be made by bonding a joining alloy, e.g., transient liquid phase bonding Au/Sn, and the organic dielectric, as a perfluoropolymer, into a laminate of circuit panels, while the outwardly extending edges 212 and 213 of the panels 21 are not bonded, so that they can act as circuitized flex cables. This flexibility or bendability allows the printed circuit boards and cards 25 to be offset from one another remote from the laminate 41.

Detailed Structural Design and Fabrication

According to a preferred embodiment of our invention, the central switch portion, i.e., the laminate portion, and the flex strips, used as card carriers in a manner analogous to expansion slots, are a single structural entity. This is achieved by selectively defining and controlling the adhesion between the layers of the structure. The layers can be either (1) discrete 2S3P (2 signal plane, 3 power plane) structures, substantially as shown in FIG. 6, or (2) combinations of discrete 2S3P (2 Signal plane, 3 power plane) and 2S1P (2 signal plane, 1 power plane) structures.

Fabrication of Vias, Through Holes, and Plated Through Hole

Another problem encountered in fabricating the individual subassemblies 21 is that it is difficult to drill the Cu/Invar/Cu foil laminates 221. This is because of the disparity of the properties of the metals in the tri-layer laminate 221. However, according to one embodiment of the invention it is now possible to produce power connections through the Cu/Invar/Cu laminate 221. According to this embodiment of our invention the copper on one side of the CIC laminate is photoetched. Than the Invar is partially etched. This is followed by drilling the Invar and drilling through the bottom layer of Cu.

This method of producing a subassembly 21, i.e., a signal/power plane building block, is characterized by reduced handling of thin cores, increased ease of signal to power plane registration, dimensional stability of signal and power planes during subsequent lamination steps, and high throughput hole punching. Moreover, this process is adaptable to parallel processing. The resulting subassemblies are triplate subassemblies.

According to a still further embodiment of the invention the vias and thru holes are punched in the individual subassemblies. Punching is accomplished using a punch having active electromagnetic damping. This allows hole punching to be carried out at both higher punching energies and faster punch cycles.

Another problem encountered in drilling the individual subassemblies is drill bit skating and wander, and concomittant misregistration. Skating and drill bit wander are pervasive problems in mechanical drilling of through holes. This is especially true in cards and boards having a metallic or ceramic surface and an organic polymeric interior. It is well known that the mechanical location of a drilled hole can be significantly improved by the provision of a small pilot hole. One problem with accurately placing pilot holes is that, for mechanical reasons, a short, hard drill must be used for the pilot hole, followed by a longer, more flexible drill for the hole.

According to the method of our invention, the pilot hole is etched into the drill entry sheet, when present, and the flexible strip. The etch may be chemical etching, for example through resist, or it may be laser etching or laser ablation.

While the invention has been described with respect to certain preferred embodiments and exemplifications, it is not intended to limit the scope of the invention, but solely by the claims appended hereto.

We claim:

1. A method of producing vias and through holes through a metal laminate, said laminate comprising a copper-invar-copper multi-layer having first and second copper layers laminated to opposite sides of an Invar layer, said method comprising the steps of:
   a. etching a clearance hole through the first copper layer on one side of the multi-layer laminate;
   b. partially etching the Invar metal layer;
   c. drilling the remaining thickness of the Invar layer and the second copper layer of the multi-layer laminate.

* * * * *